United States Patent

[11] 3,633,059

[72] Inventors Jun-ichi Nishizawa;
Tokuzo Sukegawa, both of Sendai, Japan
[21] Appl. No. 18,384
[22] Filed Mar. 13, 1970
[73] Assignee Semiconductor Research Foundation
Kawauchi, Sedai, Japan
[32] Priority June 1, 1966
[33] Japan
[31] 41/35329
Continuation of application Ser. No. 640,981, May 24, 1967. This application Mar. 13, 1970, Ser. No. 18,384

[54] ELECTROLUMINESCENT PN JUNCTION SEMICONDUCTOR DEVICE FOR USE AT HIGHER FREQUENCIES
3 Claims, 6 Drawing Figs.

[52] U.S. Cl. .......... 313/108 D, 317/234 Q, 317/235 N
[51] Int. Cl. .......... H05b 33/16
[50] Field of Search .......... 313/108 D; 317/234, 235

[56] References Cited
UNITED STATES PATENTS

| | | | |
|---|---|---|---|
| 2,938,136 | 5/1960 | Fischer | 313/108 |
| 3,208,887 | 9/1965 | Anderson | 148/33 |
| 3,333,135 | 7/1967 | Galginaitis | 313/108 |
| 3,337,779 | 8/1967 | Bowman et al. | 317/234 |

*Primary Examiner*—Raymond F. Hossfeld
*Attorneys*—Robert E. Burns and Emmanuel J. Lobato

ABSTRACT: Disclosed herein are PN junction semiconductors comprising electroluminescent devices having impurity concentration which decreases as the distance from the PN junction increases. When pulses having a duration of $10^{-6}$ to $10^{-10}$ seconds are applied forwardly across the PN junction the minority carriers are rapidly and efficiently injected into the varied concentration portion and then rapidly transferred to an adjacent long lifetime portion by the action of the established field. The minority carriers which reach and are accumulated on the adjacent long lifetime portion cause a slow transition wherein the minority carriers are recombined with the majority carriers to emit light having the effect of afterglow.

Figure 1:
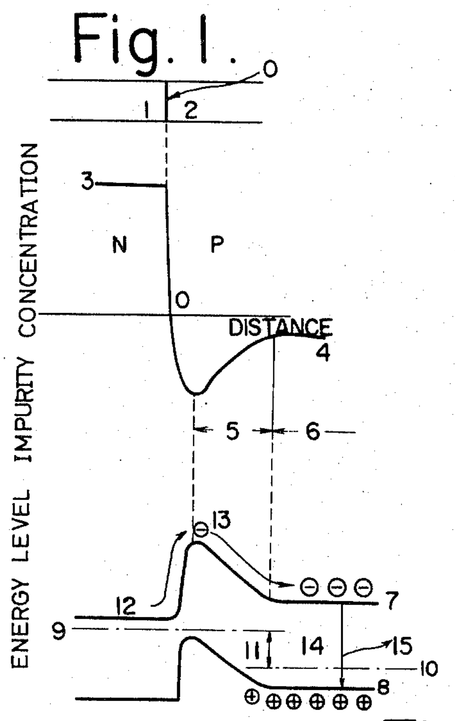

ELECTROLUMINESCENT PN JUNCTION SEMICONDUCTOR DEVICE FOR USE AT HIGHER FREQUENCIES

This application is a continuation of applicants' earlier application Ser. No. 640,981 filed May 24, 1967.

This invention relates in general to an electroluminescent semiconductor device and more particularly to electroluminescent PN junction semiconductor devices having an afterglow or persistence, and high-luminous efficiency.

Heretofore there have been proposed electroluminescent semiconductor devices of the type utilizing the phenomenon that light is emitted from the device upon recombining the majority and minority carriers in the semiconductive material in which the minority carriers are injected through the application of forward voltage across a PN junction formed in the material. Because the conventional devices have a capacitance therein, due to the injected minority carriers diffused into the semiconductive material, it is difficult to cause efficient injection of the minority carriers by means of fields produced by very short or narrow pulses or higher frequency pulses, in the form of either a voltage or a current applied across said PN-junction. Accordingly, it is difficult to cause carriers resulting in the impossibility of causing an efficient luminescence. The above-mentioned capacitance is sometimes referred to as "diffusion capacitance." In this case, even if the minority carriers are sufficient to cause an electroluminescence, there is a disadvantage in that such electroluminescence is not easily sensed because it has a very short duration.

It is, accordingly, an object of the invention to provide a new and improved electroluminescent PN-junction semiconductor device having an efficient electroluminescent characteristic at higher frequencies.

It is another object of the invention to provide a new and improved electroluminescent PN-junction semiconductor device having an afterglow persistence property.

Briefly, the invention accomplishes these objects by the provision of a wafer of semiconductive material including a region of one conductivity type and a region of opposite conductivity type arranged to define a PN-junction device. One of the regions, including at least one portion separated from the PN-junction, has established therein an electric field for accelerating the minority carriers. With pulses of very short duration, forwardly applied across the PN-junction, the minority carriers are very rapidly and efficiently injected into said one region by the action of the established field, and then rapidly transferred to the separated portion having characteristics to make said carriers long lived, the minority carriers reaching and accumulated on the last-mentioned portion effect a slow transition as they are recombined with the majority carriers, thereby emitting a light having the afterglow property. The present invention is characterized in that, by establishing an electric field for accelerating the minority carriers in at least one portion of the semiconductor adjacent the PN-junction; the injection of the minority carriers being accomplished at a high speed with a high efficiency while said injected minority carriers are rapidly transferred to and accumulated on a relatively long lifetime portion adjacent the one portion. Then a slow transition is effected to emit light with afterglow.

In order to establish the accelerating field as above described, the effective concentration of an impurity on the first portion may preferably increase and then decrease as its distance from the PN-junction increases.

The invention will become more readily apparent from the following detailed description taken in conjunction with the accompanying drawings in which:

FIG. 1 shown diagrammatically an electroluminescent device constructed in accordance with the principles of the invention; and FIGS. 2 to 6 inclusive are views similar to FIG. 1, but illustrating various modifications of the invention.

Throughout the drawings, the top portion shows in section one part of the device adjacent its PN-junction, the middle portion shows a profile of impurity concentration adjacent the PN-junction, and the bottom portion shown the corresponding energy level diagram with like reference numerals designating the corresponding components of the diagrams.

Referring now to the drawings, and FIG. 1 in particular, the principles of the invention are illustrated. As shown at the top of FIG. 1, the device comprises a wafer of any suitable semiconductive material, as will be described hereinafter as a PN-junction 0 formed between a region 1 of N conductivity-type and a region 2 of P conductivity-type. The N-type region 1 is substantially uniformly doped with any suitable donor impurity as shown at line 3 while the P-type region 2 is doped with any suitable acceptor impurity whose effective concentration is a function of a distance from the PN-junction 0 as shown at curve 4. More specifically as its distance from the PN junction increases the acceptor impurity first increases relatively rapidly and then gradually decreases at portion 5, in effective concentration until the concentration remains substantially constant. The P region portion 5, on which the effective concentration of the impurity gradually decreases, provides an electric field for accelerating the minority carriers; and, the adjacent portion 6, on which the impurity has an effective concentration which is substantially constant, provides a very low electric field whose strength is considered to be effectively zero.

The semiconductive material having a concentration profile of the donor and acceptor impurities just described, has energy states as shown on the bottom portion of FIG. 1. Namely, it has the conduction band 7 and the valence band 8. Dot-and-dash line 9 represents the pseudo-Fermi level for electrons and dot-and-dash line 10 represents the quasi Fermi level for holes.

If a voltage designated at the double headed arrow 11 is forwardly applied across the PN junction 0, the minority carriers, in this case the electrons, are injected over the barrier at the PN junction 0 into the P-type region 2 as shown at the arrow 12. The electrons thus injected are accelerated by a drift field established on the P region portion 5 while travelling along a passage 13 until they reach the P region portion 6 where they are accumulated. As previously described the electric field established on the latter portion has a negligible strength. It is to be noted that the electric field 5 should have its strength sufficient to overcome the reverse diffusion of the minority carriers accumulated on the P region portion 6 toward the N region 1.

Thus, it will be appreciated that once the minority carriers have been injected into the region portion 5 they all are passed to and accumulated on the portion 6. This ensures that after removal of the forward voltage 11 all the minority carriers accumulated on the portion 6 are prevented from being reversely diffused into the original region 1, unless a great number of the minority carriers would have been injected into the P type region 2. This contributes to a decrease in diffusion capacitance and to injection of the minority carriers with a high efficiency.

Since the minority carriers accumulated in the portion 6 have a long lifetime, they will effect slowly the transition from the conduction band 7 to the valence band 8 as shown at the arrow 14. The minority carriers reaching the valance band 8 are recombined with the majority carriers in the valence band to emit a light as designated at the arrow 15.

As the recombination 14 is effected, within the lifetime of the minority carriers, a proper selection of the magnitude of lifetime leads to the afterglow property, which is capable of being easily sensed even though the injection is effected within a very short interval of time. Therefore, as described above, this configuration initially causes the minority carriers to be rapidly injected into the P region, and then rapidly transferred by the portion 5 to the adjacent longlived portion 6. This action effectively reduces the above described diffusion capacitance, since as the injected minority carriers are rapidly transferred from the portion 5 to the portion 6, the effect of accumulated minority carriers decreases to permit the high speed injection of the minority carriers.

The principles of the invention as above described can be applied in various ways.

Figure 2:
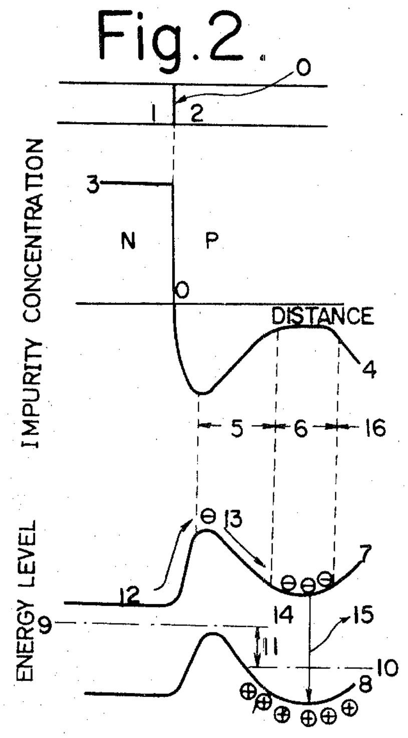

FIG. 2 shows a device according to the invention wherein its brightness is improved. The device illustrated is identical to that shown in FIG. 1 except for an additional region portion 16 disposed adjacent the long lifetime portion 6 and having such a concentration profile of the acceptor impurity that upon their entry into the portion 16 they are swept back to the long lifetime portion 6.

In order to establish an electric field for sweeping the injected minority carriers into the long lifetime portion 6 where they effect the transition and recombination with the majority carriers, an external voltage may be applied to the device. Also if desired, the junction configuration may be of resonant structure in order to exhibit a laser effect light.

Figure 3:
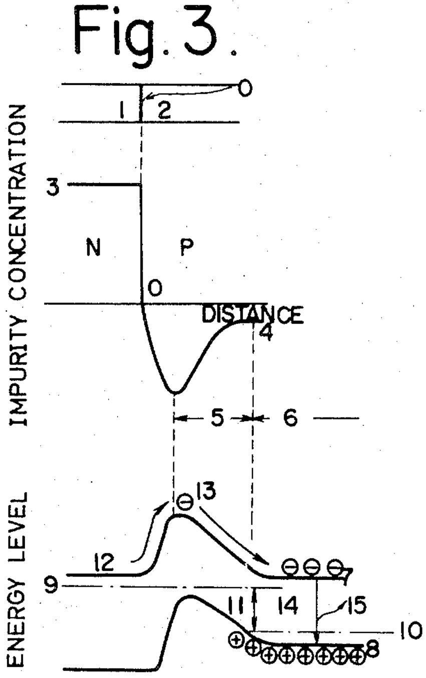

A device shown in FIG. 3 is similar to that illustrated in FIG. 1 except for means for improving the efficiency with which the minority carriers are injected into the P-type region 2. As shown in FIG. 3, the effective forbidden band width in the N-type region 1 is greater than that in the P-type region 2. To this end, the principles of the invention may be combined with the principles of a dissimilar junction which is characterized in that the application of a low voltage across the junction permits a great number of the minority carriers to be injected into the associated region.

Figure 4:
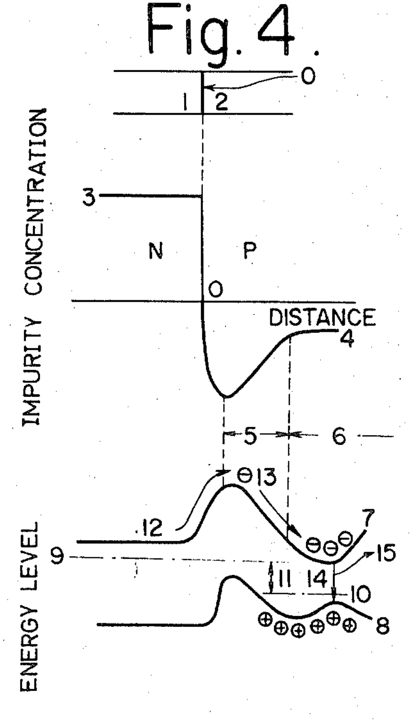

FIG. 4 illustrates another form of the invention by which light can be efficiently extracted without any portion of the light being absorbed by the semiconductive material itself. As clearly shown in FIG. 4, the effective forbidden band width, in the long lifetime portion 6, is smaller than that on any other portion. With the arrangement illustrated it is to be understood that the emitted light 15 has a wavelength which is dependent upon the effective forbidden band width on the portion 14. Also the device illustrated is additionally characterized by the utilization of another accelerating field established due to a distribution of the effective forbidden band width difference in combination with the accelerating field 5 resulting from the impurity distribution.

Figure 5:
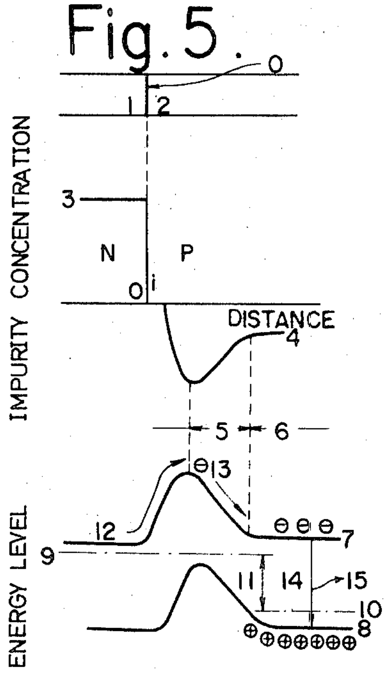

FIG. 5 shows, by way of example, the invention applied to an nip-type structure. As well known, the nip-type structure includes a layer of intrinsic semiconductive material interposed between an N-type region and a P-type region. This measure yields the combined advantage of greatly decreasing the diffusion capacitance according to the invention, and of abating the junction capacitance due to the nip-type structure with the result that the injection of the minority carriers can be effected at an especially high rate or within an interval of time further reduced.

Figure 6:
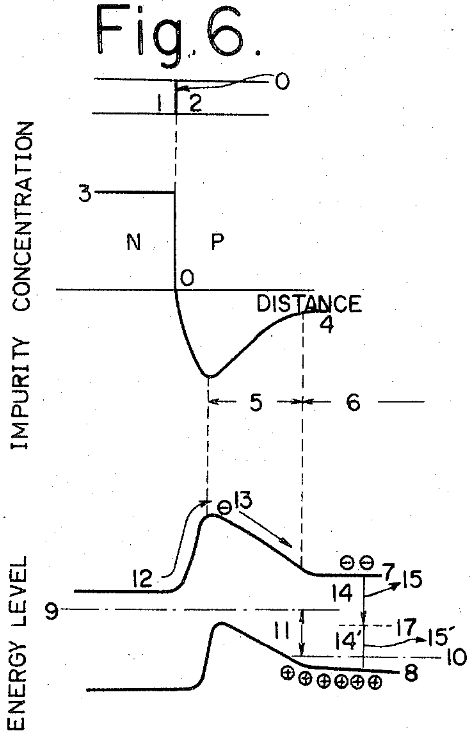

FIG. 6 shows a device similar to that illustrated in FIG. 1, except for control of both wavelength of emitted light and the afterglow time or decay characteristics of luminance after excitation. To this end, the long lifetime portion 6 has introduced thereinto an impurity having a deep level 17. The minority carriers accumulated in the portion 6 first effect the transition 14 from the conduction band 7 to the level 17 with a light emitted as designated at the arrow 15, and then effect the transition 14 from the level 17 to the valence band 8 to emit similarly a light as designated at the arrow 15'. Thus it will be appreciated that the transition is effected through the level 17 thereby to control the afterglow time and the emitted wavelength. Such an impurity may be advantageously selected from the group consisting of oxygen, gold, silver, copper, iron, nickel, chromium and cobalt. If desired, the portion 6 may have more than one of such energy levels for the impurities.

While each of the disclosed devices can be used singly as an electroluminescent device, it is to be understood that it may be effectively used in combination with any other semiconductor device. For example, the present devices may be used as indicating luminescent members provided on a display panel. They have been found particularly suitable for use in a display panel including neuristors.

The suitable semiconductive materials for use with the invention include germanium, silicon, silicon carbide (SiC), III–V compounds such as GaAs, GaSb, GaP, InSb, InAs and InP, II–VI compounds such as CdSe and CdS, lead telluride (PbTe), lead selenide (PbSe) and mixed crystals of their solid solutions. From the standpoint of the luminous efficiency the semiconductive materials of direct transition type such as GaAs, InAs, InSb, InP, $In_xGa_{1-x}$ as where $x$ represents a relative atomic composition, $GaAs_yP_{1-y}$ where $y$ also represents a relative atomic composition, etc. are preferable. However, it is to be understood that other semiconductive materials may be effectively used upon practicing the invention.

If it is desired to construct an electroluminescent device whose semiconductive material has therein the forbidden band width difference at different positions, as in the embodiment shown in FIG. 4, it is required only to prepare a crystal composed of a solid solution of two or more semiconductive materials having the forbidden bands of different widths and to redistribute its ingredients so as to provide a desired wide profile of the forbidden band width. For example, with the use of $In_xGa_{1-x}As$, indium and gallium may be redistributed such that a proportion of In to Ga has different values in different positions thereby permitting any desired magnitude of the forbidden band width lying between the widths for indium arsenide (InAs) and gallium arsenide.

In addition, it is possible to integrate the present device with another semiconductor device having a different function or functions into a single solid solution. Alternatively, the present device may be produced in contact with any transparent insulation such as glass or any semitransparent conductive film.

In practicing the invention, various processes may be used in order to form a profile of an impurity concentration in a semiconductive material of either conductivity type such as previously described in terms of the P-type region 2 shown in each of FIGS. 1 to 6 inclusive. For example, the so-called alloying after diffusion process may be used, comprising the steps of diffusing an impurity imparting to the material the same conductivity type as an impurity initially contained in the starting semiconductive material, and thereafter alloying with this treated semiconductive material an alloying material containing an impurity of opposite conductivity type in a large amount to form a PN-junction in the material. Alternatively, the alloy diffusion process may be used comprising the step of simultaneously alloying and diffusing an alloy containing both an acceptor and a donor impurity with and into the starting semiconductive material. Also the present devices may be equally produced in accordance with the double diffusion process, the growth process comprising the step of suitably adding an impurity to a crystal being grown to provide a profile of impurity concentration, the melt back process, the epitaxial growth process, or any other suitable processes.

The following examples illustrate several processes of producing the present devices.

Example I

Zinc was diffused into a substrate composed of P-type or gallium arsenide (GaAs) or gallium phosphide (GaP) having an impurity concentration of from $10^{13}$ to $10^{17}$ atoms per cubic centimeter, so as to form an impurity concentration profile providing an accelerating field in the substrate. Then tin was deposited on and alloyed with the zinc deposited surface to complete a device according to the invention.

The device was tested under the application of voltage or current pulses having a duration of from $10^{-6}$ to $10^{-7}$ second and found to effect efficient injection and to emit a persistent light.

A substrate composed of gallium phosphide having added thereto oxygen and zinc was similarly treated resulting in emission of a red light.

Example II

An amount of semiconductive gallium arsenide or phosphide was dissolved into a solvent including gallium and at least one element from the group consisting of tin, selenium and tellurium to form a liquid. Then the liquid phase process was used to grow a crystalline layer, from the liquid thus prepared, on a substrate composed of P-type gallium arsenide or phosphide having an impurity concentration of from $10^{13}$ to $10^{17}$ atoms per cubic centimeter.

The resulting layer comprised deposited gallium arsenide or phosphide and included both an N-type impurity consisting of at least one of tin, selenium and tellurium, and a P-type impurity consisting of zinc, with the N-type impurity larger in amount than the P-type impurity to impart the N conductivity-type to the grown layer. As well known, zinc has a diffusion coefficient greater than that of any one of tin, selenium and tellurium. Therefore when the substrate is subjected to heat treatment, during or after the growing operation, zinc contained in the grown layer can be diffused into the substrate thereby providing a concentration profile of the impurity in the material of the substrate for the purpose of obtaining an accelerating electric field in the substrate.

Example III

An alloy including 2 g. of gallium, 20 mg. of tellurium, 1 mg. of zinc and 0.5 g. of gallium arsenide was put on the (100) face of a substrate of gallium arsenide having zinc added thereto in a concentration of $10^{17}$ atoms per cubic centimeter and in an atmosphere of hydrogen at a temperature of from 850° to 930° C. Then the substrate and the alloy were allowed to be cooled to grow a grown crystalline layer to a thickness in order of 100 microns on the surface of the substrate. The substrate, with the grown layer, was heated in an atmosphere of arsenic under approximately one atmosphere of pressure, at from 800° to 900° C., for from 30 minutes to 2 hours, to diffuse the zinc from the grown layer into the substrate thereby to form a desired concentration profile of the impurity in the material of the substrate.

Then that face of the substrate opposite to the grown layer was polished out to a thickness in the order of approximately 200 microns. Thereafter tin was deposited on that face of the substrate on which the crystalline layer was previously grown while indium was deposited on the opposite face of the substrate. A pair of electrodes were alloyed on both faces of the substrate at a temperature in the order of 550° C. The substrate thus treated was cut in rectangles approximately 200 microns in width and approximately 500 microns in length. The resulting rectangles were suitably mounted to the respective stems and leads were soldered or brazed to the electrodes whereupon the diodes were completed.

The diodes thus produced were subjected to current pulses having a duration of approximately 10 millimicroseconds, at an amplitude of approximately 2 amperes to emit a persistent infrared radiation capable of being easily sensed.

Example IV

A wafer of P-type silicon, doped with boron to an impurity concentration of from $10^{13}$ to $10^{17}$ atoms per cubic centimeter, and having a resistivity of 20 ohms centimeter, and a lifetime of from 100 to 150 microseconds, was prepared to be approximately 200 microns thick through grinding of its (111) plane by any suitable known technique and then cut into pellets having a dimension of 2 x 2 mm. The pellets were chemically etched by any suitable known etching process. The etched pellets had applied on one face, a dot of alloy comprising silver, lead, antimony and aluminum in a proportion of 110:90:50:1, by weight, then were subjected to alloying and diffusion treatment under the condition of a vacuum, at 1,000° C., for 30 minutes, to form a junction such as shown in FIG. 1. Thereafter that face of the pellet opposite to the alloyed face was locally etched to a thickness in order of 50 microns by the jet etching process. Aluminum was alloyed into the etched face portion to provide an ohmic contact whereupon the device was completed.

The invention has various advantages. For example, the injection of minority carriers can be effected within a very short interval of time and the resulting luminescence has an afterglow property capable of being sufficiently sensed.

While the invention has been illustrated and described in conjunction with the several preferred embodiments thereof it is to be understood that various changes and modification may be made without departing from the spirit and scope of the invention. For example, the conductivity types of the regions of the device illustrated in each of FIGS. 1 to 6 inclusive may be reversed from those shown. Also any desired combinations of the devices illustrated in the drawings are feasible. In addition, any desired auxiliary junction or junctions may be incorporated into the invention to utilized the avalanch effect and/or the hook effect.

We claim:

1. An electroluminescent semiconductor device for use at higher frequencies, comprising a wafer of semiconductive material having a first region of one conductivity type and a second region of opposite conductivity type arranged to define a PN junction therebetween, said region having a distribution of impurity concentration which first increases as a distance from the PN junction increases, after which said impurity concentration decreases with a further increase in distance from the PN-junction, said distribution establishing a drift field by drifting the minority carriers injected through the PN junction in a direction to increase their distance from the PN-junction whereupon said impurity concentration remains substantially constant as the distance from the PN-junction is increased further for providing a relatively long lifetime portion on which the minority carriers transferred thereto by the action of said drift field are accumulated and emit light with afterglow through a slow transition of recombination between minority and majority carriers in said device, and wherein upon a further increase in distance from the PN junction the impurity concentration again increases to establish a drift field in a direction to prevent the minority carriers from diffusing away from said long lifetime portion.

2. An electroluminescent semiconductor device as claimed in claim 1 wherein said first region is greater in the effective width of a forbidden band than said second region thereby to increase the efficiency of minority carrier injection.

3. An electroluminescent semiconductor device having distributed effective band gaps, for use at higher frequencies, comprising a wafer of semiconductive material containing donor and acceptor impurities, and including a first region of one conductivity type and a second region of opposite conductivity type arranged to define a PN-junction with said first region, said first region having a substantially constant impurity concentration as measured from the PN-junction; said second region having a first portion adjacent said PN-junction having an impurity concentration distribution which first increases uniformly as the distance from the PN-junction increases, and then decreases upon a further increase in distance from the PN-junction for establishing a drift field for drifting minority carriers injected through the PN-junction in a direction to increase the distance from the PN-junction; a second portion spaced from said junction and disposed adjacent said first portion and having an impurity concentration which decreases to a minimum to provide a relatively long lifetime portion on which the minority carriers transferred thereto through said first portion by the action of said drift field are accumulated and emit light with afterglow through slow transition; and a third portion spaced from said first portion and disposed adjacent said second portion therein and having an effective impurity concentration which increases as the distance from the PN junction increases for establishing a drift field in a direction which prevents the minority carriers from diffusing into said third portion.

* * * * *